United States Patent [19]
Kayamoto et al.

[11] Patent Number: 5,323,359
[45] Date of Patent: Jun. 21, 1994

[54] SEMICONDUCTOR MEMORY DEVICE

[75] Inventors: Hiroshi Kayamoto; Yasunobu Tokuda, both of Suwa, Japan

[73] Assignee: Seiko Epson Corporation, Tokyo, Japan

[21] Appl. No.: 39,161

[22] PCT Filed: Aug. 26, 1992

[86] PCT No.: PCT/JP92/01078
§ 371 Date: Apr. 13, 1993
§ 102(e) Date: Apr. 13, 1993

[87] PCT Pub. No.: WO93/04476
PCT Pub. Date: Mar. 4, 1993

[30] Foreign Application Priority Data

Aug. 27, 1991 [JP] Japan .................. 3-215234

[51] Int. Cl.5 .......................... G11C 11/413
[52] U.S. Cl. .................. 365/233.5; 365/206; 365/191
[58] Field of Search .......... 365/233, 233.5, 191, 365/194, 195, 206; 307/480

[56] References Cited

U.S. PATENT DOCUMENTS 4,707,809 11/1987 Ando .................. 365/233.5
5,228,003 7/1993 Tokuda .................. 365/233.5

FOREIGN PATENT DOCUMENTS 57-8988(A) 1/1982 Japan.
62-177790(A) 8/1987 Japan.
1-101725(A) 4/1989 Japan.
2-139796(A) 5/1990 Japan.

Primary Examiner—Joseph A. Popek
Attorney, Agent, or Firm—Finnegan, Henderson, Farabow, Garrett & Dunner

[57] ABSTRACT

A noise resistant static memory device is presented which is capable of reading correct data from the memory cells even in the presence of a sharp pulse noise. This is achieved by providing a signal change detection circuit which detects that a extraneous signal having a very short pulse width has been included in the read out data. In the conventional design based on auto power-down system, this type of sharp pulse will result in the destruction of the latched data because of automatic resetting of the memory read out circuit. In the invented device, resetting is nullified simultaneously with the detection of the noise signal, thereby enabling the data read out circuit to read the data again, thereby enabling to repeat the reading step. The device thus provides noise-resistant reliable memory read out performance.

5 Claims, 9 Drawing Sheets

SEMICONDUCTOR MEMORY DEVICE

BACKGROUND OF THE INVENTION

1. Field of the Invention

The present invention relates in general to static semiconductor memory devices, such as static RAM, and relates in particular to a memory device which performs stably even if noise is superimposed on the readout control signal.

2. Technical Background of the Invention

Semiconductor memory devices, such as static RAM, are known to utilize internal synchronization method to reduce the power consumption for its operation. The internal synchronization method is a method in which the peripheral circuits of the memory cells are operated, for each change in the address memory, only during a fixed interval of time based on a base pulse signal. This method requires an address change detection circuit ATD which detects a change in the address signal and generates the above mentioned base pulse signal.

Another technique belonging to the internal synchronization method aiming to further reduce the power consumption is known as a pulse drive method. This method is based on pulse driving of the circuits for a fixed time interval, such as word line connected to the memory circuit and the sense amplifier circuit connected to the word line for detecting the data read from the memory cells, in accordance with the base pulse signal generated by the address change detection circuit ATD. This method is referred to as the word line pulse driving method, or the auto power-down method, and is effective for reducing the power consumption of static RAM devices, for example.

FIG. 9 is a schematic circuit diagram for an example of the control circuit 10 using the auto power-down method for devices such as static RAM. This control circuit 10 is provided with pulse width amplifiers 30 and 40. The pulse width amplifier 30 receives the signal via a buffer 102, and outputs signals of pulse widths governed by the delay capacitances C1-C3. The pulse width amplifier 40 receives the signal via a buffer 123, and outputs signals of pulse widths governed by the delay capacitance C4.

The operation of the control circuit 10 for memory readout will be explained with reference to FIG. 10. When there is a change in the externally supplied address signal ADDRESS, then address change detection circuit ATD (not shown) generates a address change signal $ATP_1$-$ATP_n$ in accordance with this change. The address change signals $ATP_1$-$ATP_n$ are synthesized through the switching elements 1-13 shown in FIG. 9, and inputted into the control circuit 10. The signals are inputted into the pulse width amplifier 30 or 40, through the respective buffer 102 or 123, which generate control signals APD', ATDS' having amplified signal widths as illustrated in FIG. 10.

The control signals APD', ATDS' are used to control various signals which control the overall operations of the static RAM device. For example, the control signals APD', ATDS' along with write enable signals WE', WE and chip select signals CS', CS are inputted into the signal generation circuit shown in FIGS. 4 to 6, and generate signals SAON, DOC, LAT and LAT'. The signal generation circuit shown in FIG. 4 consists of a NAND gate 400 and a buffer 401, and generates a control signal SAON for controlling the ON-OFF actions of sense amplifier circuit 50 (to be explained later) in accordance with the signals WE', ATDS' and CS supplied thereto. The signal generation circuit shown in FIG. 5 consists of buffers 500, 503 and NAND gates 501, 502, and generates a signal DOC. The signal generation circuit shown in FIG. 6 consists of NAND gates 600, 601 and buffers 602, 603, and generate signal LAT, LAT'. The signals DOC, LAT, LAT' are used to control the operation of the data output circuit 60 (to be explained later) shown in FIG. 7. When reading out data from the memory cells, the signals WE' and CS are at the high level "H" while the signals WE, CS' are at the low level "L".

As shown in FIG. 10, when the address signal ADDRESS changes, the control signal APD' changes from the low level (henceforth referred to as the L level) to the high level (henceforth referred to as the H level) while the control signal ATDS' changes from the H level to the L level. Therefore, as shown in FIG. 10, the signals SAON, DOC, LAT' change respectively to the L level, and the signal LAT changes to the H level.

At this time, the sense amplifier circuit 50 (refer to FIG. 7) becomes off state in response to signal SAON, and the P-channel pullup transistors 300, 301 both become on state, causing both output signals SO, SO' from the sense amplifier circuit 50 to be charged to the H level. Here, the clocked inverter 302, 303 supplied with the signals SO, SO' become non-transmitting in response to signal LAT' while the clocked inverter 306, 307 becomes transmitting in response to signal LAT. At this time further because the signal DOC is at the L level, the input signals GP, GN to the data outputting circuit 60 are both set to the L level. Accordingly, the P-channel transistor 350 and the N-channel transistor 351, which constitute the output driver of the data outputting circuit 60, both become off state, and the output terminal OUT becomes high impedance state.

Next, when the above mentioned signal ATDS' changes from the L level to the H level, the signals SAON, DOC and LAT' change from the respective L level to the H level, and the signal LAT changes from the H level to the L level. In this case, the sense amplifier circuit 50 (refer to FIG. 7) becomes on state because the signal SAON is at the H level, and the P-channel pullup transistors 300, 301 both become off state. Therefore, the output signals SO, SO' of the circuit 50 are supplied with the data read out from the memory cells. At this time, the clocked inverter 302, 303 become transmitting, and the clocked inverter 306, 307 become non-transmitting. Here, because the signal DOC is at the H level, one of either the signals GP or GN changes from the L level to the H level in accordance with the data read out from the memory cells. As a result, one of the P-channel transistor 350 or the N-channel transistor 351 becomes on state, and the data from the memory cells are outputted to the output terminal OUT.

Next, after the address signal ADDRESS changes as described above and a given time interval has elapsed, and suppose that the control signal APD' changes from the H level to the L level, and the signal ATDS' changes from the H level to the L level. Accordingly, both control signals SAON, LAT' change from the H level to the L level, and the signal LAT changes from the L level to the H level. When such changes take place, the sense amplifier circuit 50 shown in FIG. 7 becomes off state, and the P-channel pullup transistor 300, 301 becomes on state. Therefore, the output signals SO, SO' are again set to the H level. This means that the power consumption in the sense amplifier circuit 50 is shut down.

Further, in such a condition of the circuit, the clocked inverter 302, 303 are non-transmitting, and the clocked inverter 306, 307 are transmitting. The signal DOC maintains the H level state, the input signals GP, GN in the data outputting circuit 60 remain in latched with the data from the memory cells. Therefore, one of either the P-channel transistor 350 or the N-channel transistor 351 maintains the on state, and the data from the memory cells continue to be outputted to output terminal OUT.

In the memory devices based on the above described conventional auto power-down system, the pulse widths of the control signals APD', ATDS' are determined by the pulse width amplifier 30, 40 (refer to FIG. 9). It is essential that these signals APD', ATDS' be structured such that the memory cell data can be read out correctly even when a false data, for example noise, represented by A' in FIG. 10 is generated during a change in the address signal ADDRESS. To cope with such problems, the control circuit 10 shown in FIG. 9 rapidly switches the control signal APD' from the L level to the H level, by utilizing a number of transistors 108–110 to charge or discharge the nodes of the pulse width amplifier 30. Accordingly, the auto power-down system is rapidly reset to enable repeated reading out of the correct data in accordance with the correct address signal A which follows the false address signal A' caused by the noise. The series of events are illustrated in the latter half of FIG. 10.

However, delay capacitances C1, C2 and C3 are connected to the nodes of the pulse width amplifier 30 for controlling the pulse width of the control signal APD. Therefore, to completely reset the auto power-down mode, it is necessary to completely charge or discharge all of the nodes. In other words, in the node B shown in FIG. 10, it becomes necessary to have a pulse signal of a pulse width which maintains the H level for a specific time interval or duration (designated by T1).

For example, if a noise A' such as the one shown in FIG. 11 appears in the address signal ADDRESS a pulse signal having a pulse width less than T1 is created in the node B (shown in amplifier 30 circuit in FIG. 9). This phenomenon prevents complete charging or discharging of each node in the pulse width amplifier 30, thus generating a control signal APD of a short width. When such a control signal APD having a short pulse width is generated, the control signal ATDS' outputted from the pulse width amplifier 40 (refer to FIG. 9) maintains the L level. In response to such changes in the control signals APD', ATDS', the output signals from each of the signal generating circuits shown in FIGS. 4 to 6, behave as illustrated in FIG. 11. That is, signals SAON, LAT' maintains the L level and the signal LAT maintains the H level, and only the signal DOC becomes the L level signal having a short pulse duration.

In such a condition, the sense amplifier circuit 50 and the data outputting circuit 60 behave as follows. Because the signal SAON becomes the L level, the sense amplifier circuit 50 retains the off state. The signal LAT' and the signal LAT remain at the L level, therefore, the clocked inverter 302, 303 become non-transmitting while the clocked inverter 306, 307 remains transmitting. At this time, the data outputting circuit 60 is inputted with the latched data read out from the memory cells, and one of either the P-channel transistor 350 or the N-channel transistor 351 is retained in the on state. As a result, the data read out from the memory cells are continued to be outputted to the output terminal OUT.

In this condition, if an L level signal is generated only in the signal DOC, the latched data in the signals GP, GN to be inputted to the data outputting circuit 60 are destroyed, and both signals GP, GN are reset to the L level. Therefore, the P-channel transistor 350 and the N-channel transistor 351 both become off state, and this created the problem that ultimately the readout data could not be outputted from the output terminal OUT.

The static semiconductor memory device of the present invention was developed in view of the problems of the existing memory devices as described above, and the objective is to present a highly reliable memory device which is unaffected by external as well as internal noises.

SUMMARY OF THE INVENTION

A semiconductor memory device is presented for reading data quickly and reliably without being affected by internal and external noises, comprising:

(a) address change detection circuit means for detecting a change in an address signal and generating a change signal representing said change in address signal;

(b) control circuit means for generating a first control signal and a second control signal to instruct data read out in accordance with said change signal;

(c) read out circuit means activated by said first control signal for reading out data from memory cells in accordance with said first control signal, and (d) outputting circuit means for latching said output data from said read out circuit means and outputting latched data in accordance with said second control signal;

wherein said device further comprises:

(e) reset nullifying circuit means for detecting changes at least in said second control signal and generating a reset nullifying signal and supplying said reset nullifying signal to said control circuit means, wherein said control circuit means nullifies a reset state upon receiving said reset nullifying signal, and generate said second control signal of a specific pulse width.

According to the memory device of such a configuration, if the control circuit device is reset by a noise effect, and generates the second control signal having a pulse width less than a specific value, the reset nullifying device detects the change in the second control signal and generates a reset nullifying signal, and forwards the reset nullifying signal to the control circuit device. The control circuit device, upon receiving the reset nullifying signal, nullifies its reset state, and generates another second signal having the specific pulse width value. Therefore, the output circuit device is able to output correct data without destroying the latched data, and is able to resume normal operation. Even if the noise is such as to destroy the latched data, the correct data can be read out again after the reset is nullified. The device is thus noise resistant and provides reliable performance.

PREFERRED EMBODIMENTS OF THE INVENTION

Preferred embodiments of the invention will be explained in the following with reference to the drawings.

Figure 1:
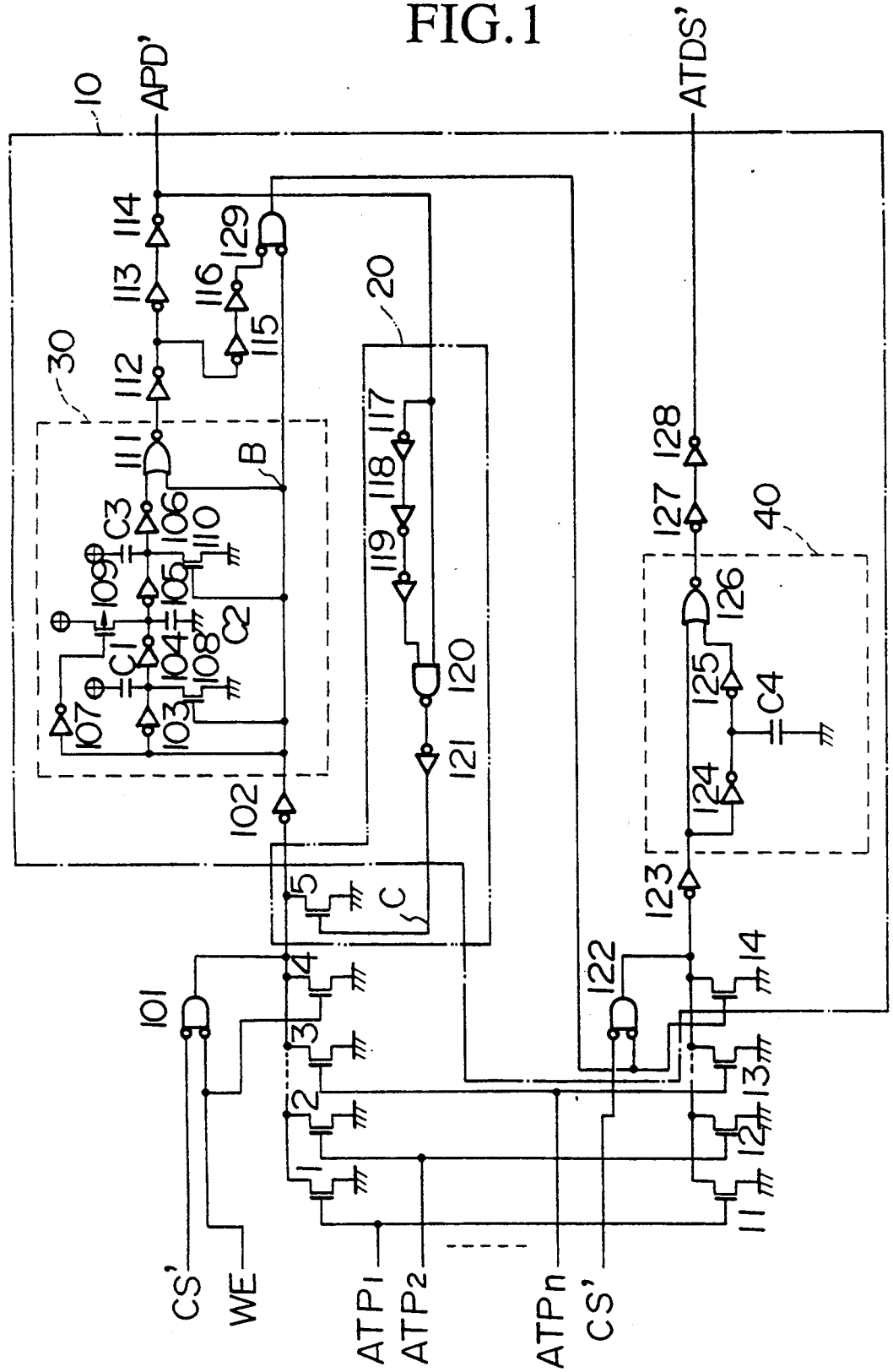
FIG. 1 is a circuit diagram for the control circuit 10 of a first embodiment of the present invention.
Figure 9:
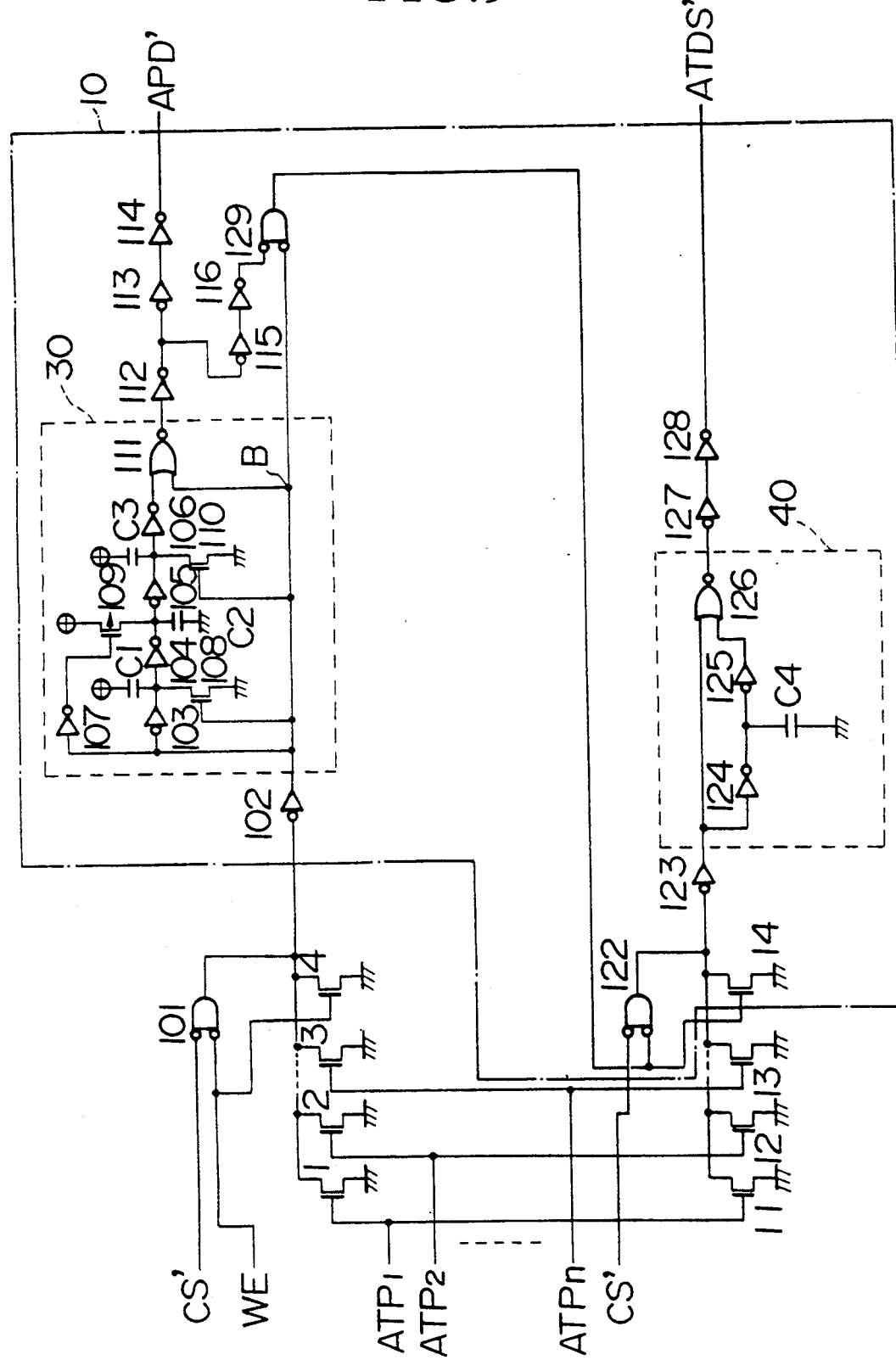
FIG. 9 is a circuit diagram showing the conventional type of control circuit 10.

FIG. 1 is a circuit diagram for the control circuit 10 according to the first embodiment of the invention. The control circuit 10 shown here is applicable to memory devices, such as static RAM, using the auto power-down method which operates similar to the method described earlier. The difference between the invented circuit shown in Figures and the conventional system shown in FIG. 9 is the provision of the signal change detection circuit 20 which will be described in further detail later. The function of the signal change detection circuit 20 is to detect a change in the control signal APD outputted from the control circuit 10 from the L level to the H level, and to nullify the reset state (to be described later) of the control circuit 10 when the change is detected.

Figure 4:
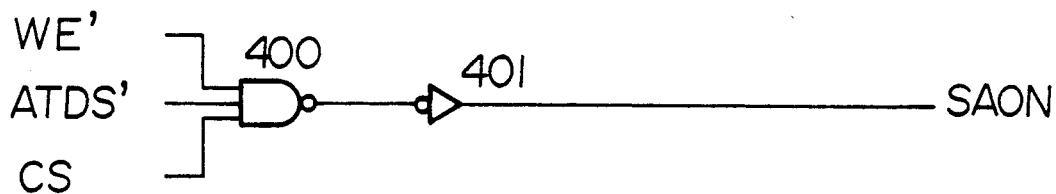
FIG. 4 is a circuit diagram for signal generating circuit for a signal SAON.
Figure 5:
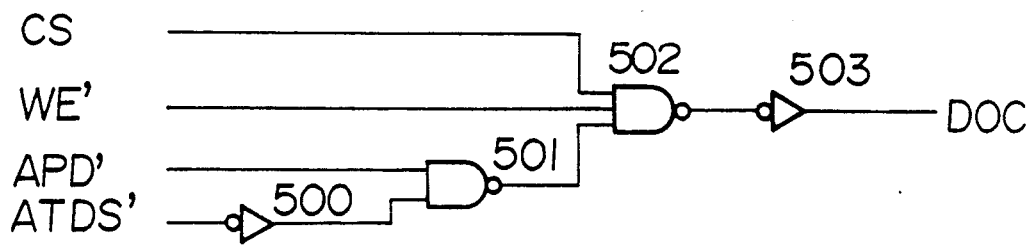
FIG. 5 is a circuit diagram for signal generating circuit for a signal DOC.
Figure 6:
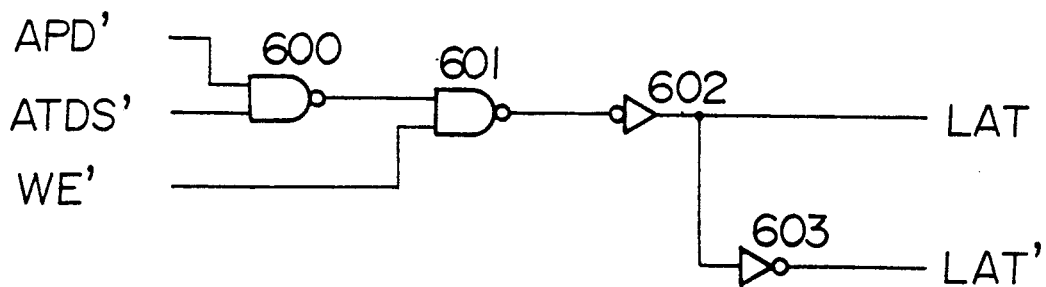
FIG. 6 is a circuit diagram for signal generating circuit for signals LAT, LAT'.
Figure 10:
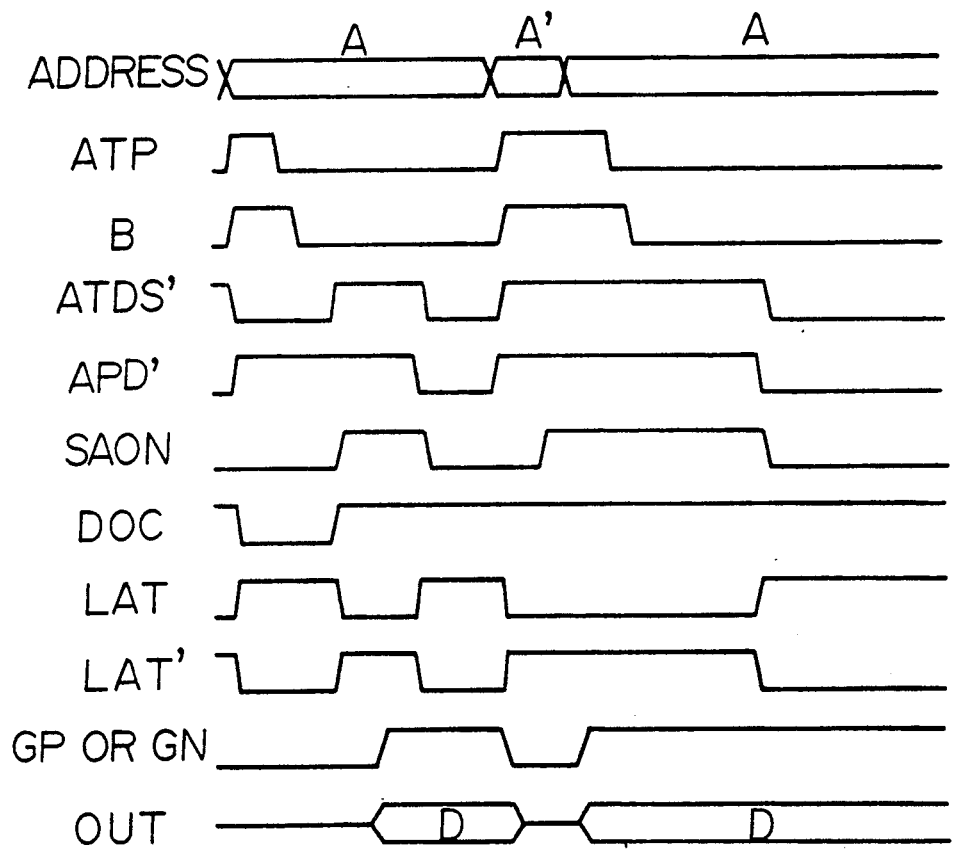
FIG. 10 presents waveforms for explaining the readout operations in the conventional type of control circuit 10.
Figure 11:
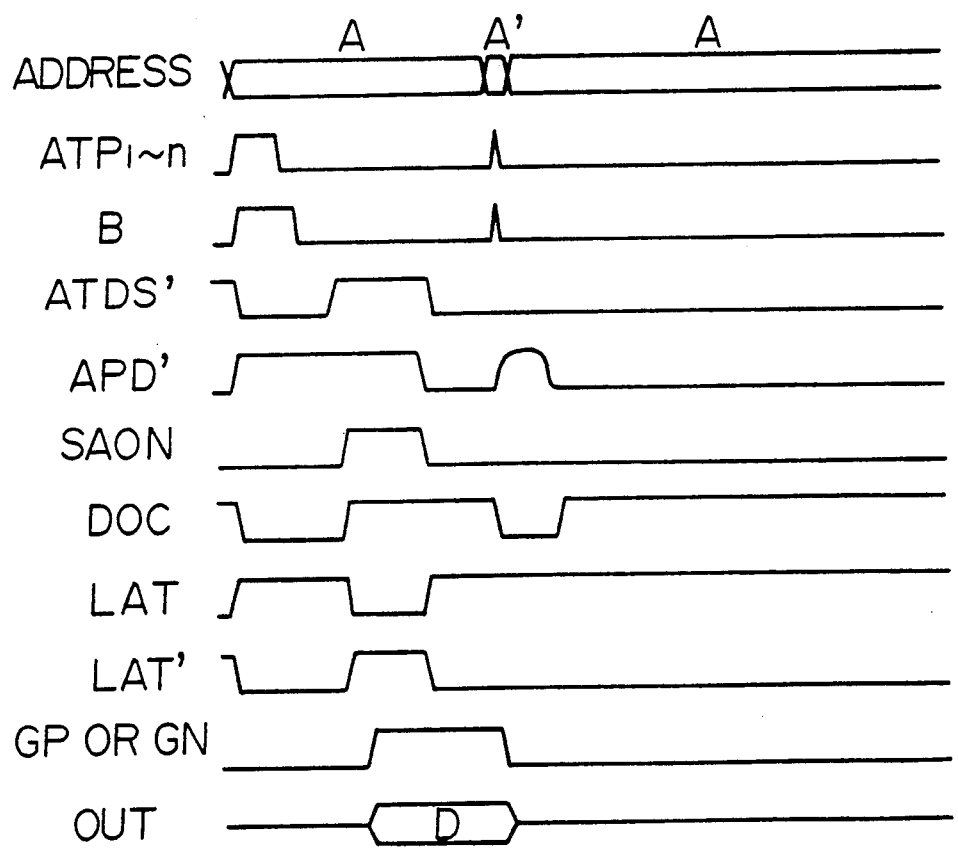
FIG. 11 presents waveforms for explaining the readout operations in the conventional type of control circuit 10 when noise is introduced.

The subsequent stages of the control circuit 10 shown in FIG. 1 are provided with the signal generation circuits shown in FIGS. 4 to 6 as in the conventional devices. Further, the signals SAON, DOC, LAT and LAT' generated by these signal generating circuits are supplied to the sense amplifier circuit 50 and to the data outputting circuit 60, and are configured to read out data in accordance with the address signal ADDRESS. In other words, the normal reading operation in the first embodiment is the same as that shown in FIG. 10.

Next, the reading operation of the control circuit 10 when noise is superimposed on the address signal ADDRESS will be explained with reference to FIG. 8. In such a case, a false address data A' in the address signal ADDRESS is generated. In the conventional system, this leads to a generation of a pulse signal having a pulse width less than T1 at node B (refer to FIG. 9) which produced a control signal APD' of a short pulse width, disabling the outputting operation of the readout data from the output terminal OUT of the data outputting circuit 60. The signal change detection circuit 20 in the first embodiment of the present invention is provided to resolve this difficulty. The following explains the operation of the invented memory device when a pulse of a pulse width shorter than T1 is generated at the node B shown in FIG. 1 due to a line noise for example. This noise pulse corresponds to the false address data A' shown in FIG. 8.

In the circuit configuration shown in FIG. 1, when a pulse of H level having a pulse width shorter than T1 appears at the node B in the control circuit 10, the pulse width amplifier 30 is unable to perform complete charging or discharging of all the nodes. However, when the control signal APD' changes from the L level to the H level, such a change is detected by the signal change detection circuit 20 which generates a reset nullifying signal having a sufficient pulse width (say T2).

This reset nullifying signal places switching elements 5 disposed in the earlier stages of the control circuit 10 in the on state. The result is the pulse width amplifier 30 is given a pulse signal having sufficient pulse duration (width) to enable complete charging or discharging of all the nodes. Therefore, the pulse width amplifier 30 outputs a control signal APD' of the correct pulse width as shown in FIG. 8. The control signal ATDS' changes from the L to H level when the control signal APD' changes from the L to H level. The control signal ATDS' changes from the H to the L level when the control signal APD' changes from the H to L level. The end results is that at the stage of the control signal APD' changing from the L to H level, the entire static RAM device of the first embodiment changes from the reset state to the active state. In other words, the reset state has been nullified by the reset nullifying signal. Accordingly, even if a false address data A' appears, the readout operation to read the data from the memory cell can be resumed.

Figure 7:
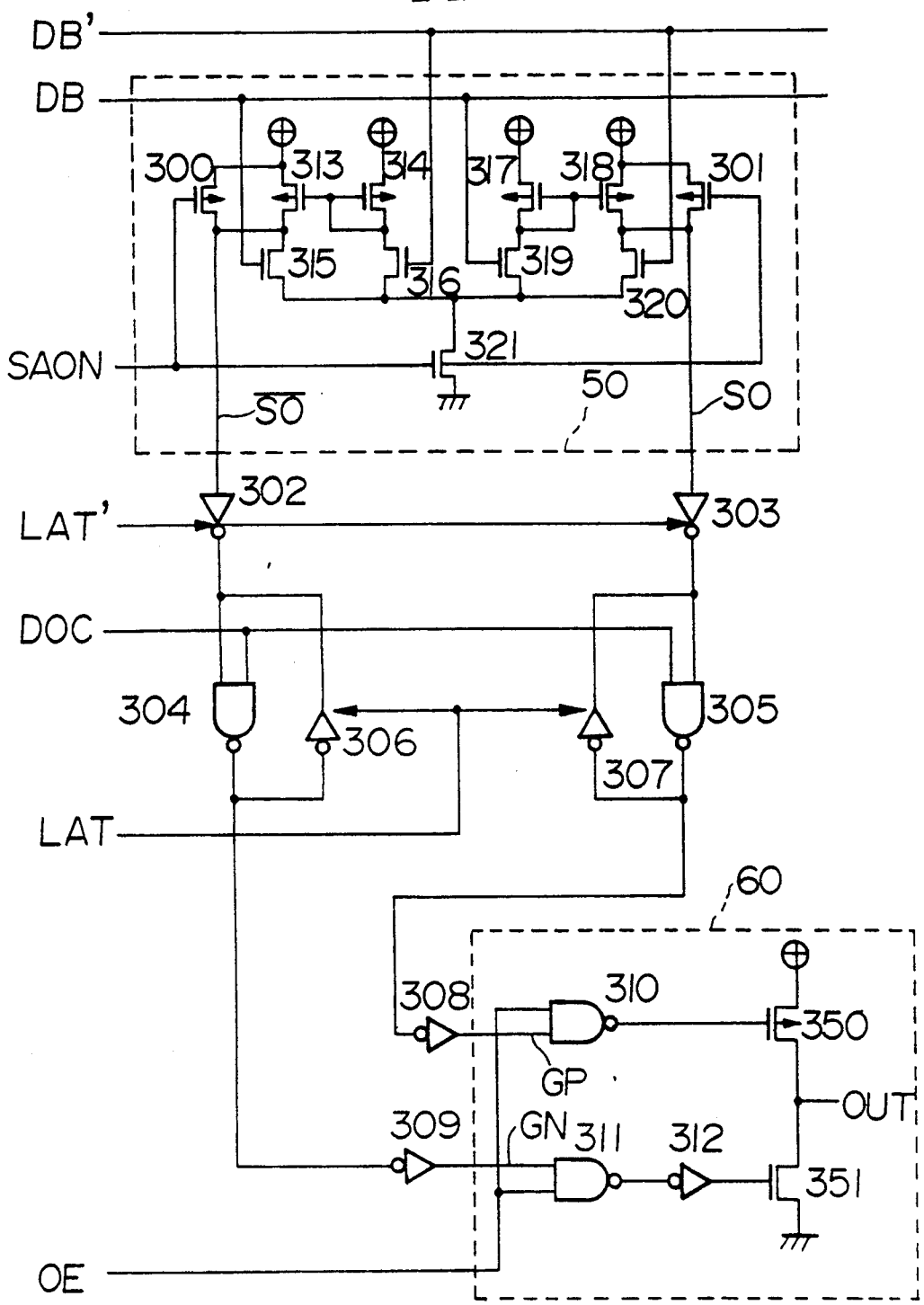
FIG. 7 is a diagram showing sense amplifier circuit 50 and data outputting circuit 60.

Next, when the control signals APD' and ATDS' change from L to H level, the signal DOC maintains the H level, the signals SAON, LAT' change from L to H level, and the signal LAT changes from H to L level. Accordingly, the sense amplifier circuit 50 shown in FIG. 7 becomes on state, and the P-channel pullup transistor 300, 301 becomes off state. The result is that the signals SO, SO' outputted from the sense amplifier circuit 50 correspond to the data read out from the memory cells.

Next, in this condition, clocked inverter 302, 303 become transmitting, and the clocked inverter 306, 307 become non-transmitting. At this stage, because the control signal DOC is in the H level, one of either the GP signal or the GN signal changes from the L to H level depending on the content of the data read out from the memory cells. Accordingly, one of either the P-channel transistor 350 or the N-channel transistor 351 (which constitute the output driver of the data outputting circuit 60) becomes on state. The result is that data read out from the memory cells is outputted to the output terminal OUT. Even if noise shown by dotted line in FIG. 8 is generated in the signal DOC, the sense amplifier circuit 50 maintains the on state, and outputs data read out of the memory cells, the data reading operation can be continued without any interference from the noise signal.

Figure 8:
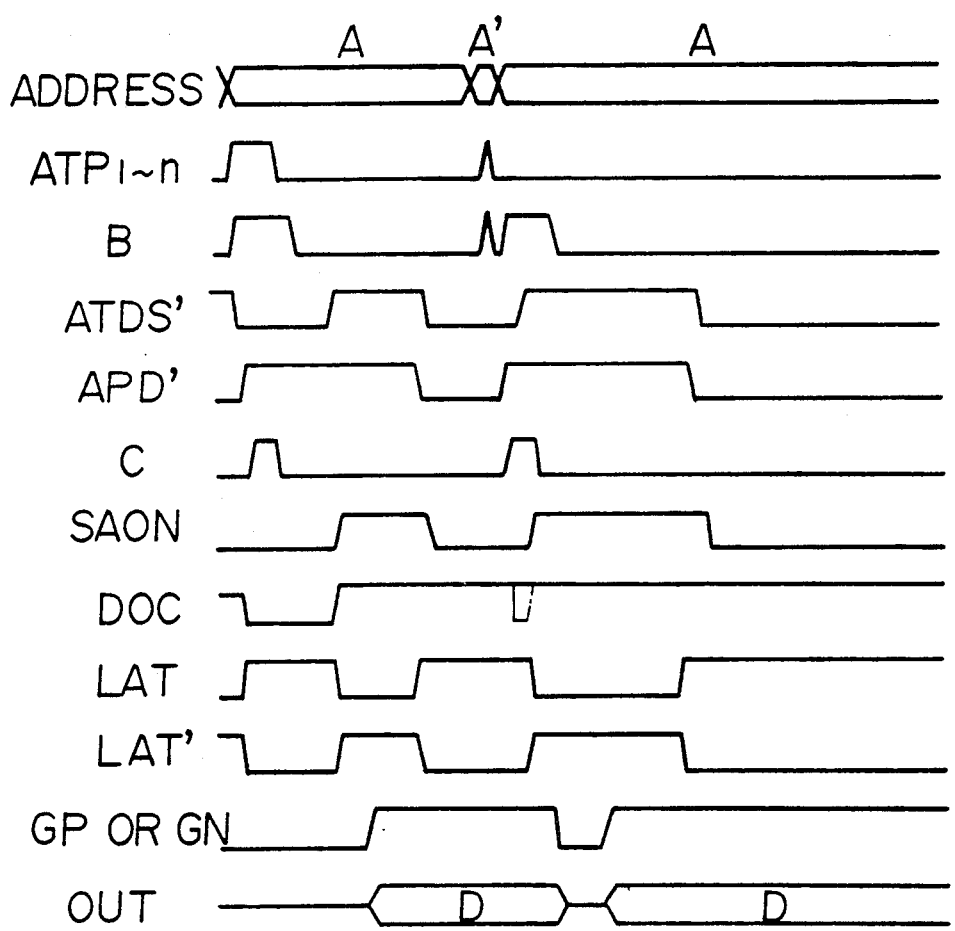
FIG. 8 presents the waveforms for explaining the operation of the first embodiment.

Next, after a specific time interval has elapsed, the control signal APD' changes from H to L level, and the control signal ATDS' changes from H to L level as shown in FIG. 8. Next, in accordance with such changes, the signals SAON, LAT' change from H to L level, and the signal LAT changes from L to H level. In this condition, the sense amplifier circuit 50 shown in FIG. 7 becomes off state, thus making the P-channel pullup transistors 300, 301 to be in the on state. Accordingly, the output signals SO, SO' from the sense amplifier circuit 50 are charged to the H level. The power consumption of the sense amplifier circuit 50 is reduced at this stage, thus providing the auto power-down mode operation.

Furthermore, the clocked inverters 302, 303 which are supplied with signals SO, SO' become non-transmitting while the clocked inverters 306, 307 become transmitting. Here, the control signal DOC remains at the H level, the input signals GP, GN become latched state to the data read out from the memory cells. The result is that one of either the P-channel transistor 350 or the N-channel transistor 351 remains in the on state, and the read out data continue to be outputted from the output terminal OUT.

According to the first embodiment presented above, when a noise signal is superimposed on internal signals such as address signal ADDRESS, the circuits are arranged so that the control circuit 10 is released from the reset state synchronously with the detection of the noise signal by the signal change detection circuit 20. Subsequently, the normal reading operation is carried out without any interference, therefore, even if noise is generated and the data from the memory cells is destroyed in the control circuit 10, the reset state is nullified thus enabling the data to be read again. Therefore, the invented memory device provides noise-resistant reading operation of high reliability.

Figure 2:
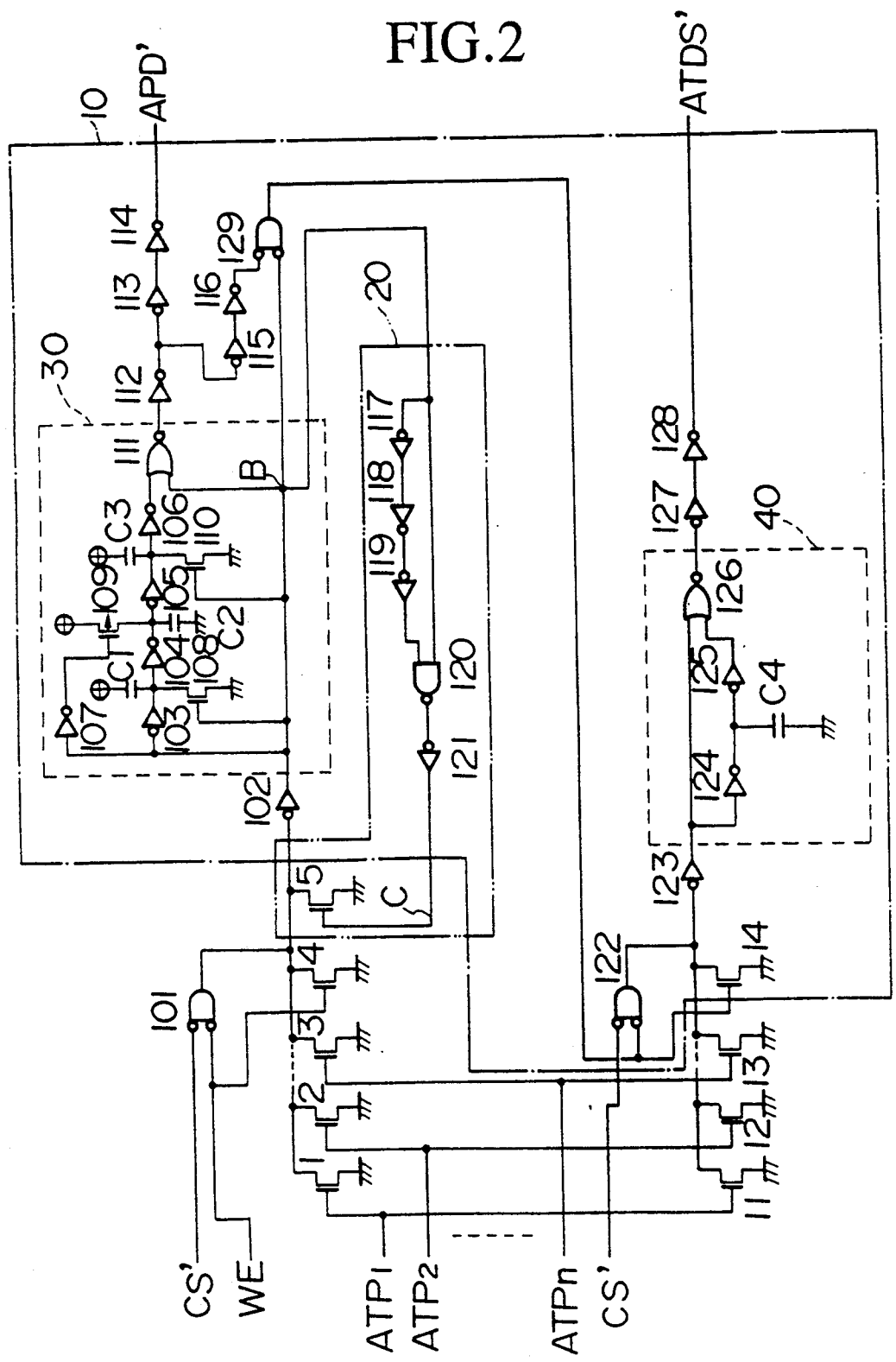
FIG. 2 is a circuit diagram for the control circuit 10 of a second embodiment of the present invention.
Figure 3:
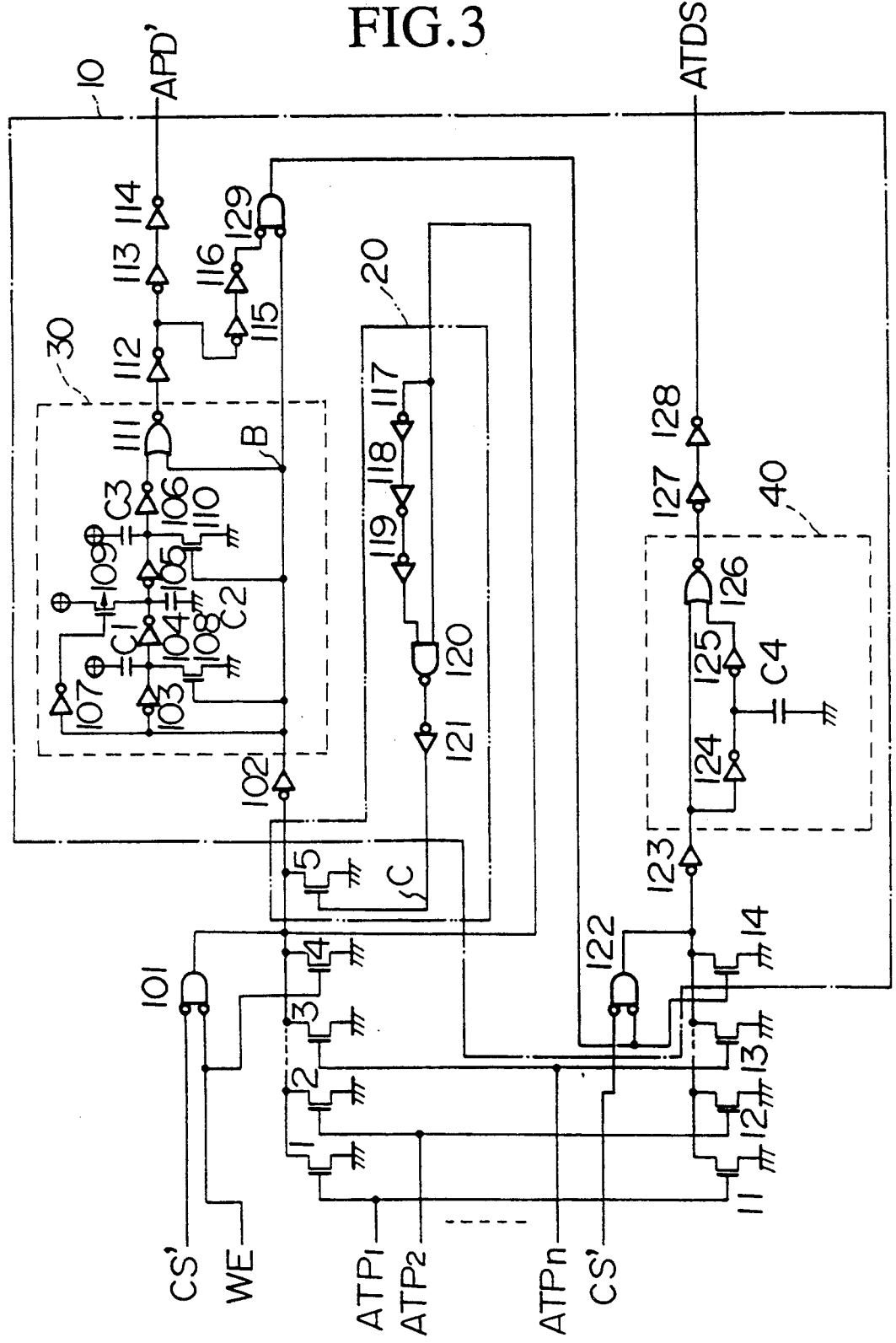
FIG. 3 is a circuit diagram for the control circuit 10 of a third embodiment of the present invention.

In the first embodiment presented, a change in the control signal APD in the control circuit 10 are detected by the signal change detection circuit 20. However, the same effect can be produced by a second embodiment shown in FIG. 2, which is designed to detect a change either in the internal signal within the control circuit 10 or in the internal nodes (for example node B). In other word, it is possible to replace the control signal APD inputted into the signal change detection circuit 20 in the first embodiment, with a signal from node B to detect signal changes. The same effect as in the first embodiment is obtained by adopting an arrangement, as shown in a third embodiment in FIG. 3, which utilizes the signal change detection circuit 20 for detecting changes in the address change signal $ATP_1$-$ATP_n$.

In the first embodiment, during the normal reading operation without the superimposed noise, when the pulse width of the generated pulse signal becomes the same as that of the address change signals $ATP_1$-$ATPn$, it leads to undesirable lengthening of the access time for accessing the data in the memory cells. This problem can be readily rectified by making the pulse width of the reset nullifying signal generated from the signal change detection circuit 20 shorter than that of the address change signal $ATP_1$-$ATP_n$ as well as by setting the terminal ends of both pulse signals at the same timing or by advancing the down timing for the trailing edge of the pulse of the reset nullifying signal.

What is claimed is:

1. A semiconductor memory device comprising:
    (a) address change detection circuit means for detecting a change in an address signal and generating a change signal representing said change in address signal;
    (b) control circuit means for receiving said change signal and generating a first control signal and a second control signal to instruct data read out in accordance with said change signal;
    (c) read out circuit means activated by said first control signal for reading out data from memory cells in accordance with said first control signal, and
    (d) outputting circuit means for latching said output data from said read out circuit means and outputting latched data in accordance with said second control signal;
  wherein said device further comprises:
    (e) reset nullifying circuit means for detecting changes at least in said second control signal, and generating a reset nullifying signal and supplying said reset nullifying signal to said control circuit means, whereupon said control circuit means nullifies a reset state, and generate another second control signal of a specific pulse width.

2. A semiconductor memory device as claimed in claim 1, wherein said reset nullifying circuit means detect an internal signal of said control circuit means or changes in said change signal, and generate said reset nullifying signal.

3. A semiconductor memory device as claimed in claim 1, wherein a pulse width of said reset nullifying signal is shorter than a pulse width of said change signal.

4. A semiconductor memory device as claimed in claim 1, wherein said reset nullifying signal and said change signal are generated so as to synchronize the terminal ends of both signals.

5. A semiconductor memory device as claimed in claim 1, wherein the trailing edge of said reset nullifying signal changes earlier in time than the trailing edge of said change signal.

* * * * *